United States Patent
Adermann et al.

(10) Patent No.: US 10,801,105 B2
(45) Date of Patent: Oct. 13, 2020

(54) PROCESS FOR THE GENERATION OF THIN INORGANIC FILMS

(71) Applicant: BASF SE, Ludwigshafen am Rhein (DE)

(72) Inventors: Torben Adermann, Ludwigshafen (DE); Daniel Loeffler, Ludwigshafen (DE); Carolin Limburg, Ludwigshafen (DE); Falko Abels, Ludwigshafen (DE); Hagen Wilmer, Ludwigshafen (DE); Monica Gill, Charlottetown (CA); Matthew Griffiths, Ottawa (CA); Sean Barry, Ottawa (CA)

(73) Assignee: BASF SE, Ludwigshafen am Rhein (DE)

( * ) Notice: Subject to any disclaimer, the term of this patent is extended or adjusted under 35 U.S.C. 154(b) by 132 days.

(21) Appl. No.: 15/775,856

(22) PCT Filed: Nov. 18, 2016

(86) PCT No.: PCT/EP2016/078099
§ 371 (c)(1),
(2) Date: May 14, 2018

(87) PCT Pub. No.: WO2017/089230
PCT Pub. Date: Jun. 1, 2017

(65) Prior Publication Data
US 2018/0320265 A1 Nov. 8, 2018

(30) Foreign Application Priority Data

Nov. 24, 2015 (EP) .................................... 15196031

(51) Int. Cl.
*C23C 16/18* (2006.01)
*C07F 15/06* (2006.01)
*C23C 16/455* (2006.01)

(52) U.S. Cl.
CPC .............. *C23C 16/18* (2013.01); *C07F 15/06* (2013.01); *C23C 16/45553* (2013.01)

(58) Field of Classification Search
CPC ... C23C 16/18; C23C 16/45553; C23C 16/22; C07F 15/06
(Continued)

(56) References Cited

U.S. PATENT DOCUMENTS

| 7,332,032 B2 * | 2/2008 | Vaartstra ................. C23C 16/40 117/201 |
| 2005/0042372 A1 * | 2/2005 | Denk .................... C07C 257/12 427/248.1 |

(Continued)

FOREIGN PATENT DOCUMENTS

WO    WO 2012/155264 A1    11/2012

OTHER PUBLICATIONS

Brittanica (https://www.britannica.com/science/coordination-number accessed online Nov. 26, 2019) (Year: 1998).*

(Continued)

*Primary Examiner* — Michael P Wieczorek
*Assistant Examiner* — Michael G Miller
(74) *Attorney, Agent, or Firm* — Oblon, McClelland, Maier & Neustadt, L.L.P.

(57) ABSTRACT

The present invention is in the field of processes for the generation of thin inorganic films on substrates, in particular atomic layer deposition processes. The present invention relates to a process comprising bringing a compound of general formula (I) into the gaseous or aerosol state and depositing the compound of general formula (I) from the gaseous or aerosol state onto a solid substrate, wherein $R^1$, $R^2$, $R^3$, and $R^4$ are independent of each other an alkyl group, an aryl group or a trialkylsilyl group, M is Mn, Ni or Co, X (Continued)

is a ligand which coordinates M, wherein at least one X is a neutrally charged ligand, m is 1, 2 or 3 and n is at least 1 wherein the molecular weight of the compound of general formula (I) is up to 1000 g/mol.

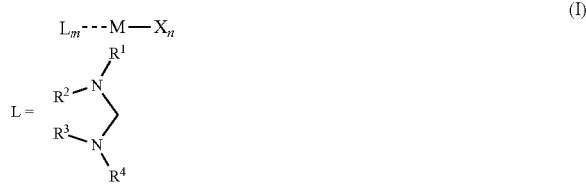

(I)

14 Claims, 1 Drawing Sheet

(58) Field of Classification Search
USPC .......................................... 427/248.1–255.7
See application file for complete search history.

(56) References Cited

U.S. PATENT DOCUMENTS

| 2007/0123060 | A1* | 5/2007 | Rahtu | C23C 16/405 |
| | | | | 438/783 |
| 2008/0248648 | A1* | 10/2008 | Thompson | C07F 17/00 |
| | | | | 438/681 |
| 2009/0226612 | A1 | 9/2009 | Ogawa et al. | |
| 2012/0323008 | A1* | 12/2012 | Barry | C07F 1/08 |
| | | | | 546/11 |

OTHER PUBLICATIONS

Gillespie (Gillespie et al, "Gilbert N. Lewis and the Chemical Bond: The Electron Pair and the Octet Rule from 1916 to the Present Day", Journal of Computational Chemistry vol. 28 No. 1 (2006), pp. 87-97, accessed online Nov. 22, 2019) (Year: 2006).*
Collomb ("Manganese: Inorganic & Coordination Chemistry", Collomb et al, Encyclopedia of Inorganic Chemistry, 13 pages, published 2006) (Year: 2006).*
Sweigart ("Manganese: Organometallic Chemistry", Sweigart et al, Encyclopedia of Inorganic and Bioinorganic Chemistry, originally published in Encyclopedia of Inorganic Chemistry, 11 pages, 2006) (Year: 2006).*
U.S. Appl. No. 15/114,666, filed Jul. 27, 2016, US 2016/0348243 A1, Ke Xu et al.
U.S. Appl. No. 15/325,840, filed Jan. 12, 2017, US 2017/0175267 A1, Julia Strautmann et al.
U.S. Appl. No. 15/501,631, filed Feb. 3, 2017, US 2017/0233865 A1, Julia Strautmann et al.
U.S. Appl. No. 15/557,178, filed Sep. 11, 2017, US 2018/0044357 A1, Jan Spielmann et al.
International Search Report and Written Opinion dated Feb. 22, 2017 in PCT/EP2016/078099, 8 pages.
Search Report dated May 23, 2016 in European Patent Application No. 15196031.7, 3 pages.
Herrmann, W.A. et al. "Metal complexes of acyclic diaminocarbenes: links between N—heterocyclic carbene (NHC)- and Fischer-carbene complexes", Journal of Organometallic Chemistry, vol. 684, No. 1-2, XP004467733, 2003, pp. 235-248.
George, S.M. "Atomic Layer Deposition: An Overview", Chemical Review, vol. 110, No. 1, 2010, pp. 111-131.
Yang, J. et al. "Direct-liquid-evaporation chemical vapor deposition of smooth, highly conformal cobalt and cobalt nitride thin films", Journal of Materials Chemistry C, vol. 3, 2015, pp. 12098-12106.

* cited by examiner

PROCESS FOR THE GENERATION OF THIN INORGANIC FILMS

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements of the quality of such films become stricter. Thin inorganic films serve different purposes such as barrier layers, dielectrica, conducting features, capping, or separation of fine structures. Several methods for the generation of thin inorganic films are known. One of them is the deposition of film forming compounds from the gaseous state on a substrate. In order to bring metal atoms into the gaseous state at moderate temperatures, it is necessary to provide volatile precursors, e.g. by complexation the metals with suitable ligands. These ligands need to be removed after deposition of the complexed metals onto the substrate.

WO 2012/155264 A1 discloses diaminocarbene complexes with copper, silver and gold. However, for manganese, nickel and cobalt it turned out that the complexes are not volatile and not stable enough during evaporation.

It was an object of the present invention to provide a process for the generation of Mn-, Ni- and/or Co-containing films of high quality and reproducibility on solid substrates under economically feasible conditions. It was desired that this process can be performed with as little decomposition of the precursor comprising Mn, Ni and/or Co as possible before it is in contact with the solid substrate. At the same time it was desired to provide a process in which the precursor is easily decomposed after deposited on a solid substrate. It was also aimed at providing a process using Mn-, Ni- or Co-containing precursors which can easily be modified and still remain stable in order to fit the precursor's properties to the particular needs.

These objects were achieved by a process comprising bringing a compound of general formula (I) into the gaseous or aerosol state

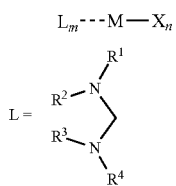

(I)

and depositing the compound of general formula (I) from the gaseous or aerosol state onto a solid substrate, wherein $R^1$, $R^2$, $R^3$, and $R^4$ are independent of each other an alkyl group, an aryl group or a trialkylsilyl group, M is Mn, Ni or Co, X is a ligand which coordinates M, wherein at least one X is a neutrally charged ligand, m is 1, 2 or 3 and n is at least 1 wherein the molecular weight of the compound of general formula (I) is up to 1000 g/mol.

The present invention further relates to the use of a compound of general formula (I), wherein $R^1$, $R^2$, $R^3$, and $R^4$ are independent of each other an alkyl group, an aryl group or a trialkylsilyl group, M is Mn, Ni or Co, X is a ligand which coordinates M, wherein at least one X is a neutrally charged ligand, m is 1, 2 or 3 and n is at least 1 for a film formation process on a solid substrate, wherein the molecular weight of the compound of general formula (I) is up to 1000 g/mol.

Preferred embodiments of the present invention can be found in the description and the claims. Combinations of different embodiments fall within the scope of the present invention.

In the process according to the present invention a compound of general formula (I) is brought into the gaseous or aerosol state. The ligand L is normally bound to M via the carbon atom which is bound to both nitrogen atoms. In general, this carbon atom has no further substituent in addition to the two nitrogen atoms and the metal atom. That is why such compounds are often referred to as carbene compounds. According to the present invention, m is 1, 2 or 3, preferably 1 or 2, in particular 1.

$R^1$, $R^2$, $R^3$, and $R^4$ are independent of each other an alkyl group, an aryl group or a trialkylsilyl group, preferably an alkyl group. $R^1$, $R^2$, $R^3$, and $R^4$ can be all the same or two or three are the same and the remaining are different or they are all different to each other. Preferably, at least two of $R^1$, $R^2$, $R^3$, and $R^4$ are the same, more preferably $R^1$ and $R^2$ are the same and independent thereof $R^3$ and $R^4$ are the same, even more preferably at least three are the same, in particular all are the same, for example all are methyl, ethyl, n-propyl, or iso-propyl. It is possible that $R^1$ and $R^2$ are connected to each other such that they form a ring including the nitrogen atom they are attached to. Similarly, $R^3$ and $R^4$ can be connected to each other such that they form a ring including the nitrogen atom they are attached to.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, 2-ethyl-hexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl or ethyl. Alkyl groups can be substituted, for example by halogens such as F, Cl, Br, I, in particular F; by hydroxyl groups; by ether groups; by trialkylsilyl groups such as trimethylsilyl; by amines such as dialkylamines; or by phosphanes such as trialkylphosphanes.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A trialkylsilyl group can bear the same or different alkyl groups. Preferably, the trialkylsilyl group bears $C_1$ to $C_6$ alkyl groups, more preferably $C_1$ to $C_4$ alkyl groups. Examples for a trialkylsilyl group with the same alkyl groups are trimethylsilyl, triethylsilyl, tri-n-propylsilyl, triiso-propylsilyl, tricyclohexylsilyl. Examples for a trialkylsilyl group with different alkyl groups are dimethyl-tert-butylsilyl, dimethylcyclohexylsilyl, methyl-di-iso-propylsilyl.

According to the present invention the molecular weight of the compound of general formula (I) is up to 1000 g/mol, preferably up to 800 g/mol, in particular up to 600 g/mol, such as up to 500 g/mol.

According to the present invention the ligand X in the compound of general formula (I) can be any ligand which coordinates M. If the compound of general formula (I) contains more than one X, all X can be the same or different to each other, preferably at least two X are different to each other, in particular all X are different to each other. Any or all X can be in any ligand sphere of M, e.g. in the inner ligand sphere, in the outer ligand sphere, or only loosely associated to M. Preferably, X is in the inner ligand sphere of M. It is believed that if all ligand X are in the inner ligand sphere of M the volatility of the compound of general formula (I) is high such that it can be brought into the gaseous or aerosol state without decomposition.

The ligand X in the compound of general formula (I) according to the present invention includes anions of halogens like fluoride, chloride, bromide or iodide and pseudohalogens like cyanide, isocyanide, cyanate, isocyanate, thiocyanate, isothiocyanate, or azide. Further suitable ligands X are alkyl anions like methyl, ethyl, butyl, or neopentyl anions as well as silicon bearing alkyl groups such as trimethylsilyl methyl. Another possible ligand X is hydride, nitric oxide (NO) and carbonmonoxide (CO).

Furthermore, X can be a ligand which coordinates M via a neutral or anionic nitrogen atom, for example by deprotonation before coordination to M. Such ligands include amine ligands in which the coordinating nitrogen atom is either aliphatic like in dialkylamine, piperidine, pyrrolidine, morpholine, alkylsilylamines such as hexamethyldisilazane or trimethylsilyl tertbutylamine; or aromatic like in pyrrole, indole, pyridine, or pyrazine. Preferably, X is a ligand which coordinates via at least two neutral or anionic nitrogen atoms. These include amidinates such as acetamidine or N,N'-bis-isopropylacetamidine; guanidinates such as guanidine; aminoimines such as 2-N-tertbutylamino-2-methylpropanal-N-tertbutylimine; diimines such as glyoxal-N,N'-bistertbutyl-diimine, glyoxal-N,N'-bis-isopropyl-diimine, or 2,4-pentanedione-diimine; diketiminates such as N,N'-2,4-pentanediketiminate; iminopyrroles including pyrrol-2-carbald-alkylimines such as pyrrol-2-carbald-ethylimine, pyrrol-2-carbald-isopropylimine, or pyrrol-2-carbald-tert-butylimine as well as pyrrol-2,5-biscarbald-alkyldiimines such as pyrrol-2,5-biscarbald-tertbutyldiimine.

It is also possible that X is a ligand in which an oxygen atom coordinates to M. Examples are alkanolates such as methanolate, ethanolate and isopropanolate, tetrahydrofurane, acetylacetonate and its derivatives such as 1,5-di-tert-butyl-acetylacetonate or 1,1,1,5,5,5-pentafluoroacetylacetone. Other suitable examples for X include both a nitrogen and an oxygen atom which both coordinate to M including dimethylamino-iso-propanol, formamide, acetamide, 2,4-pentandione-N-alkylimines such as 2,4-pentandione-N-isopropylimine.

Also suitable for X are ligands which coordinate via a phosphor atom to M. These include trisubstituted phosphines including trialkylphosphines, dialkylarylphosphines, alkyl-diarylphosphines or triarylphosphines, wherein the alkyl or the aryl groups can be the same or different to each other if more than one alkyl or aryl group is present. Examples include trimethyl phosphine, tritertbutyl phosphine, tricyclohexyl phosphine, di-isopropyl-tert-butyl phosphine, dimethyl-tert-butyl phosphine, triphenyl phosphine, and tritolylphosphine.

X can also be an unsaturated hydrocarbon which coordinates with a π-bond to M. These can be aliphatic or aromatic, preferably aliphatic. Unsaturated hydrocarbons include olefins like ethylene, propylene, iso-butylene, cyclohexene, cyclooctene, cyclooctadiene, styrene; and alkynes like ethyne, propyne, 2-butyne. X can also be an unsaturated anionic hydrocarbon which can coordinate both via the anion and the unsaturated bond such as allyl, 2-methyl-allyl or 1,3-bis(trimethylsilyl)-allyl. Aromatic X which coordinate via a π-bond to M include cyclopentadiene anions and its derivatives; benzene and its derivatives such as toluene or xylene.

Preferably, the ligands X is a ligand which coordinates M via a nitrogen or a phosphor atom or X is an aliphatic hydrocarbon, an alkanolate, cyanide, bromide, CO, or NO. Particularly preferred ligands X are methyl, ethyl, propyl, neopentyl, trimethylsilyl methyl, dimethylamide, diethylamide, hexamethyldisilazane, trimethylsilyl tert.-butyl amide, allyl, 2-methyl-allyl, 2-N-tertbutylamino-2-methylpropanal-N-tertbutylimine, N,N'-bis-isopropylacetamidine, glyoxal-N,N'-bis-tertbutyl-diimine, glyoxal-N,N'-bis-isopropyl-diimine, pyrrol-2-carbald-ethylimine, pyrrol-2-carbald-isopropylimine or pyrrol-2-carbald-tert-butylimine, methanolate, ethanolate, CO, NO, trimethylphosphine, triethylphosphine, dimethyl-tert-butyl phosphine, di-isopropyl-tert-butyl phosphine, cyanide, bromide, ethylene, cyclooctene, cyclooctadiene, or 2-butyne, in particular CO, NO, or trimethylphosphine.

According to the present invention, at least one X is a neutrally charged ligand. Generally, a neutrally charged ligand is a ligand, which can be isolated as a molecule which has the same formula and configuration as the ligand in the complex and which has no electric charge. Neutrally charged ligands include CO, NO, amines, phosphines, ethers, unsaturated hydrocarbons. Examples for these ligands are described above. Preferred neutral ligands are CO, NO, or a trialkylphosphine. Preferably, at least two ligands L are neutrally charged, more preferably at least three.

According to the present invention, n is at least 1. Usually, the bulkier X is the lower is n. For small X, for example CO and/or NO, n is preferably at least 2, more preferably at least 3.

The metal M is Mn, Ni or Co, i.e. manganese, nickel or cobalt, preferably Ni or Co, in particular Co. The metal M can be in various oxidation states, for example −1, 0, +1, +2, +3, or +4. Preferably, X and n are chosen such that the compound of general formula (I) is electrically neutral. It has been found out that particular stability of the compound of general formula (I) while maintaining sufficient reactivity for the process according to the present invention can be achieved if the number of valence electrons of M is even, for example 14, 16, or 18. Therefore, X and n in the compound of general formula (I) are preferably chosen to adjust the number of valence electrons of M to an even number. The valence electrons are counted as typical in the field of complex chemistry: Co provides 9 valence electrons, Ni 10;

a monodentate anionic ligand is counted as providing one valence electron, a monodentate electrically neutral non-radical ligand as providing two electrons, a monodentate electrically neutral radical as providing one valence electron if it does not coordinate via a lone electron pair to M and three valence electrons if it coordinates via a lone electron pair. The carbene ligand L is counted as providing two valence electrons. Multidentate ligands are counted as if all coordinating atoms were placed on several separate monodentate ligands.

Some preferred examples for compounds of general formula (I) are given in the following table.

| No. | $R^1$ | $R^2$ | $R^3$ | $R^4$ | m | M | X | n |
|---|---|---|---|---|---|---|---|---|
| C-1 | methyl | methyl | methyl | methyl | 1 | Co | CO<br>CO<br>NO | 3 |
| C-2 | ethyl | ethyl | ethyl | ethyl | 1 | Co | CO<br>CO<br>NO | 3 |
| C-3 | methyl | methyl | methyl | methyl | 1 | Co | CO<br>$PMe_3$<br>NO | 3 |
| C-4 | methyl | methyl | methyl | methyl | 1 | Co | $PMe_3$<br>$PMe_3$<br>NO | 3 |
| C-5 | methyl | methyl | methyl | methyl | 1 | Co | COD<br>NO | 2 |
| C-6 | methyl | methyl | methyl | methyl | 2 | Co | NO | 1 |
| C-7 | methyl | methyl | methyl | methyl | 2 | Ni | CO | 1 |
| C-8 | methyl | methyl | methyl | methyl | 1 | Co | CO<br>DPMA | 2 |
| C-9 | methyl | methyl | methyl | methyl | 1 | Co | $PMe_3$<br>DPMA | 2 |
| C-10 | methyl | methyl | methyl | methyl | 1 | Co | CO<br>HMG | 2 |
| C-11 | methyl | methyl | methyl | methyl | 1 | Co | $PMe_3$<br>HMG | 2 |
| C-12 | methyl | methyl | methyl | methyl | 1 | Co | CO<br>TAMPTI | 2 |
| C-13 | methyl | methyl | methyl | methyl | 1 | Co | $PMe_3$<br>TAMPTI | 2 |
| C-14 | methyl | methyl | ethyl | ethyl | 1 | Co | CO<br>$PMe_3$<br>NO | 3 |
| C-15 | methyl | methyl | ethyl | ethyl | 1 | Co | $PMe_3$<br>$PMe_3$<br>NO | 3 |
| C-16 | methyl | methyl | ethyl | ethyl | 1 | Co | COD<br>NO | 2 |
| C-17 | methyl | methyl | ethyl | ethyl | 1 | Co | DPMA<br>CO | 2 |
| C-18 | methyl | methyl | ethyl | ethyl | 1 | Co | DPMA<br>$PMe_3$ | 2 |
| C-19 | methyl | methyl | ethyl | ethyl | 1 | Co | CO<br>TAMPTI | 2 |
| C-20 | methyl | methyl | ethyl | ethyl | 1 | Co | $PMe_3$<br>TAMPTI | 2 |
| C-21 | methyl | methyl | methyl | methyl | 1 | Ni | CO<br>CO<br>CN | 3 |
| C-22 | methyl | methyl | methyl | methyl | 1 | Ni | NO<br>$PMe_3$<br>NO | 3 |
| C-23 | methyl | methyl | methyl | methyl | 1 | Ni | COD<br>CO | 2 |
| C-24 | methyl | methyl | methyl | methyl | 1 | Mn | CO<br>CO<br>NO | 3 |
| C-25 | methyl | methyl | methyl | methyl | 1 | Mn | CO<br>CO<br>CO<br>NO | 4 |
| C-26 | methyl | methyl | methyl | methyl | 2 | Mn | CO<br>CO<br>NO | 3 |
| C-27 | methyl | methyl | methyl | methyl | 2 | Mn | CO<br>NO | 2 |
| C-28 | ethyl | ethyl | ethyl | ethyl | 1 | Mn | CO<br>CO<br>CO<br>NO | 4 |

-continued

| No. | R¹ | R² | R³ | R⁴ | m | M | X | n |
|---|---|---|---|---|---|---|---|---|
| C-29 | ethyl | ethyl | ethyl | ethyl | 1 | Mn | CO<br>CO<br>NO | 3 |
| C-30 | methyl | methyl | methyl | methyl | 1 | Mn | CO<br>PMe₃<br>NO | 3 |
| C-31 | methyl | methyl | methyl | methyl | 1 | Mn | PMe₃<br>PMe₃<br>NO | 3 |
| C-32 | methyl | methyl | ethyl | ethyl | 1 | Mn | PMe3<br>PMe₃<br>NO | 3 |
| C-33 | ethyl | ethyl | ethyl | ethyl | 1 | Co | CO<br>PMe₃<br>NO | 3 |
| C-34 | ethyl | ethyl | ethyl | ethyl | 1 | Co | PMe₃<br>PMe₃<br>NO | 3 |
| C-35 | ethyl | ethyl | ethyl | ethyl | 2 | Co | CO<br>NO | 2 |
| C-36 | ethyl | ethyl | ethyl | ethyl | 2 | Co | NO | 1 |
| C-37 | ethyl | ethyl | ethyl | ethyl | 1 | Co | COD<br>NO | 2 |
| C-38 | ethyl | ethyl | ethyl | ethyl | 1 | Co | DPMA<br>CO | 2 |
| C-39 | ethyl | ethyl | ethyl | ethyl | 1 | Co | DPMA<br>PMe₃ | 2 |
| C-40 | ethyl | ethyl | ethyl | ethyl | 1 | Co | HMG<br>CO | 2 |
| C-41 | ethyl | ethyl | ethyl | ethyl | 1 | Co | HMG<br>PMe₃ | 2 |
| C-42 | iso-propyl | iso-propyl | iso-propyl | iso-propyl | 1 | Co | CO<br>CO<br>NO | 3 |
| C-43 | iso-propyl | methyl | methyl | iso-propyl | 1 | Co | CO<br>CO<br>NO | 3 |
| C-44 | iso-propyl | iso-propyl | iso-propyl | iso-propyl | 1 | Co | CO<br>PMe₃<br>NO | 3 |
| C-45 | iso-propyl | methyl | methyl | iso-propyl | 1 | Co | CO<br>PMe₃<br>NO | 3 |
| C-46 | methyl | ethyl | ethyl | methyl | 1 | Ni | CO<br>CO<br>PMe₃ | 3 |
| C-47 | methyl | methyl | methyl | methyl | 1 | Co | CO<br>CO<br>CN | 3 |
| C-48 | methyl | methyl | methyl | methyl | 2 | Ni | methyl<br>methyl | 2 |
| C-49 | methyl | methyl | methyl | methyl | 1 | Co | TMS-Me<br>PMe₃<br>CO | 3 |
| C-50 | iso-propyl | methyl | methyl | iso-propyl | 1 | Ni | styrene<br>CO<br>methyl | 3 |
| C-51 | ethyl | ethyl | ethyl | ethyl | 1 | Ni | 2-butyne<br>CO<br>CO | 3 |
| C-52 | methyl | iso-propyl | iso-propyl | methyl | 1 | Co | 2-butyne<br>CO<br>NO | 3 |
| C-53 | methyl | methyl | methyl | methyl | 1 | Ni | CO<br>CO<br>PMe₃ | 3 |
| C-54 | methyl | methyl | ethyl | ethyl | 1 | Co | CO<br>PMe₃<br>NO | 3 |
| C-55 | iso-propyl | iso-propyl | methyl | methyl | 1 | Co | CO<br>CO<br>NO | 3 |
| C-56 | iso-propyl | iso-propyl | methyl | methyl | 1 | Ni | CO<br>CO<br>CO | 3 |

-continued

| No. | R¹ | R² | R³ | R⁴ | m | M | X | n |
|-----|-----|-----|-----|-----|---|----|------|---|
| C-57 | iso-propyl | iso-propyl | methyl | methyl | 1 | Co | CO<br>PMe₃<br>NO | 3 |
| C-58 | iso-propyl | iso-propyl | methyl | methyl | 1 | Ni | CO<br>CO<br>PMe₃ | 3 |

PMe$_3$ stands for trimethylphosphine, COD for 1,5-cycloctadiene, DPMA for N,N-diisopropyl-2-methylamidinate, TMS-Me for trimethylsilyl methyl, HMG for hexamethylguanidinate, TAMPTI for 2-N-tertbutylamino-2-methylpropanal-N-tertbutylimine.

The compound of general formula (I) used in the process according to the present invention is preferably used at high purity to achieve the best results. High purity means that the substance employed contains at least 90 wt.-% compound of general formula (I), preferably at least 95 wt.-% compound of general formula (I), more preferably at least 98 wt.-% compound of general formula (I), in particular at least 99 wt.-% compound of general formula (I). The purity can be determined by elemental analysis according to DIN 51721 (Prüfung fester Brennstoffe—Bestimmung des Gehaltes an Kohlenstoff and Wasserstoff—Verfahren nach Radmacher-Hoverath, August 2001).

In the process according to the present invention the compound of general formula (I) is brought into the gaseous or aerosol state. This can be achieved by heating the compound of general formula (I) to elevated temperatures. In any case a temperature below the decomposition temperature of the compound of general formula (I) has to be chosen. Preferably, the heating temperature ranges from slightly above room temperature to 300° C., more preferably from 30° C. to 250° C., even more preferably from 40° C. to 200° C., in particular from 50° C. to 150° C.

Another way of bringing the compound of general formula (I) into the gaseous or aerosol state is direct liquid injection (DLI) as described for example in US 2009/0 226 612 A1. In this method the compound of general formula (I) is typically dissolved in a solvent and sprayed in a carrier gas or vacuum. Depending on the vapor pressure of the compound of general formula (I), the temperature and the pressure the compound of general formula (I) is either brought into the gaseous state or into the aerosol state. Various solvents can be used provided that the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable. The aerosol comprising the compound of general formula (I) should contain very fine liquid droplets or solid particles. Preferably, the liquid droplets or solid particles have a weight average diameter of not more than 500 nm, more preferably not more than 100 nm. The weight average diameter of liquid droplets or solid particles can be determined by dynamic light scattering as described in ISO 22412:2008. It is also possible that a part of the compound of general formula (I) is in the gaseous state and the rest is in the aerosol state, for example due to a limited vapor pressure of the compound of general formula (I) leading to partial evaporation of the compound of general formula (I) in the aerosol state.

Alternatively, the metal-containing compound or the reducing agent can be brought into the gaseous state by direct liquid evaporation (DLE) as described for example by J. Yang et al. (Journal of Materials Chemistry, 2015). In this method, the metal-containing compound or the reducing agent is mixed with a solvent, for example a hydrocarbon such as tetradecane, and heated below the boiling point of the solvent. By evaporation of the solvent, the metal-containing compound or the reducing agent is brought into the gaseous state. This method has the advantage that no particulate contaminants are formed on the surface.

It is preferred to bring the compound of general formula (I) into the gaseous or aerosol state at decreased pressure. In this way, the process can usually be performed at lower heating temperatures leading to decreased decomposition of the compound of general formula (I).

It is also possible to use increased pressure to push the compound of general formula (I) in the gaseous or aerosol state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

In the process according to the present invention a compound of general formula (I) is deposited on a solid substrate from the gaseous or aerosol state. The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the compound of general formula (I) is deposited onto them, it is preferably to keep them in motion. This can, for example, be achieved by stirring, by rotating drums, or by fluidized bed techniques.

The deposition takes place if the substrate comes in contact with the compound of general formula (I). Generally, the deposition process can be conducted in two different ways: either the substrate is heated above or below the decomposition temperature of the compound of general formula (I). If the substrate is heated above the decomposition temperature of the compound of general formula (I), the compound of general formula (I) continuously decomposes on the surface of the solid substrate as long as more compound of general formula (I) in the gaseous or aerosol state reaches the surface of the solid substrate. This process is typically called chemical vapor deposition (CVD). Usually, an inorganic layer of homogeneous composition, e.g. the metal oxide or nitride, is formed on the solid substrate as the organic material is desorbed from the metal M. Typically the solid substrate is heated to a temperature in the range of 300 to 1000° C., preferably in the range of 350 to 600° C.

Alternatively, the substrate is below the decomposition temperature of the compound of general formula (I). Typically, the solid substrate is at a temperature equal to or lower than the temperature of the place where the compound of general formula (I) is brought into the gaseous or aerosol state, often at room temperature or only slightly above. Preferably, the temperature of the substrate is at least 30° C. lower than the place where the compound of general formula (I) is brought into the gaseous or aerosol state. Preferably, the temperature of the substrate is from room temperature to 400° C., more preferably from 100 to 300° C., such as 150 to 220° C.

The deposition of the compound of general formula (I) onto the solid substrate is either a physisorption or a chemisorption process. Preferably, the compound of general formula (I) is chemisorbed on the solid substrate. One can determine if the compound of general formula (I) chemisorbs to the solid substrate by exposing a quartz microbalance with a quartz crystal having the surface of the substrate in question to the compound of general formula (I) in the gaseous or aerosol state. The mass increase is recorded by the eigen frequency of the quartz crystal. Upon evacuation of the chamber in which the quartz crystal is placed the mass should not decrease to the initial mass, but about a monolayer of the residual compound of general formula (I) remains if chemisorption has taken place. In most cases where chemisorption of the compound of general formula (I) to the solid substrate occurs, the x-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the compound of general formula (I), typically a monolayer is deposited on the solid substrate. Once a molecule of general formula (I) is deposited on the solid substrate further deposition on top of it usually becomes less likely. Thus, the deposition of the compound of general formula (I) on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen and dielektrischen Materialeigenschaften sowie der Schichtdicke dünner Schichten mittels Ellipsometrie; February 2004).

Often it is desired to build up thicker layers than those just described. In order to achieve this in the process according to the present invention it is preferable to decompose the deposited compound of general formula (I) by removal of all L and X after which further compound of general formula (I) is deposited. This sequence is preferably performed at least twice, more preferably at least 10 times, in particular at least 50 times. Removing all L and X in the context of the present invention means that at least 95 wt.-% of the total weight of L and X in the deposited compound of general formula (I) are removed, preferably at least 98 wt.-%, in particular at least 99 wt.-%. The decomposition can be effected in various ways. The temperature of the solid substrate can be increased above the decomposition temperature.

Furthermore, it is possible to expose the deposited compound of general formula (I) to a plasma like an oxygen plasma or a hydrogen plasma; to oxidants like oxygen, oxygen radicals, ozone, nitrous oxide ($N_2O$), nitric oxide (NO), nitrogendioxde ($NO_2$) or hydrogenperoxide; to reducing agents like hydrogen, alcohols, hydroazine or hydroxylamine; or solvents like water. It is preferable to use oxidants, plasma or water to obtain a layer of a metal oxide. Exposure to water, an oxygen plasma or ozone is preferred. Exposure to water is particularly preferred. If layers of elemental metal are desired it is preferable to use reducing agents. Preferred examples are hydrogen, hydrogen radicals, hydrogen plasma, ammonia, ammonia radicals, ammonia plasma, ammonia derivatives like tert-butylamine, iso-propylamine, dimethylamine, methylethylamine, or diethylamine; hydrazine or hydrazine derivatives like N,N-dimethylhydrazine; silane, disilane, trisilane, cyclopentasilane, cyclohexasilane, dimethylsilane, diethylsilane, or trisilylamine; more preferably hydrogen, hydrogen radicals, hydrogen plasma, ammonia, ammonia radicals, ammonia plasma, hydrazine, N,N-dimethylhydrazine, silane; in particular hydrogen. The reducing agent can either directly cause the decomposition of the deposited compound of general formula (I) or it can be applied after the decomposition of the deposited compound of general formula (I) by a different agent, for example water. For layers of metal nitrides it is preferable to use ammonia or hydrazine. Typically, a low decomposition time and high purity of the generated film is observed.

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (I) is very versatile, so the process parameters can be varied in a broad range. Therefore, the process according to the present invention includes both a CVD process as well as an ALD process.

Depending on the number of sequences of the process according to the present invention performed as ALD process, films of various thicknesses are generated. Preferably, the sequence of depositing the compound of general formula (I) onto a solid substrate and decomposing the deposited compound of general formula (I) is performed at least twice. This sequence can be repeated many times, for example 10 to 500, such as 50 or 100 times. Usually, this sequence is not repeated more often than 1000 times. Ideally, the thickness of the film is proportional to the number of sequences performed. However, in practice some deviations from proportionality are observed for the first 30 to 50 sequences. It is assumed that irregularities of the surface structure of the solid substrate cause this non-proportionality.

One sequence of the process according to the present invention can take from milliseconds to several minutes, preferably from 0.1 second to 1 minute, in particular from 1 to 10 seconds. The longer the solid substrate at a temperature below the decomposition temperature of the compound of general formula (I) is exposed to the compound of general formula (I) the more regular films formed with less defects.

The process according to the present invention yields a film. A film can be only one monolayer of deposited compound of formula (I), several consecutively deposited and decomposed layers of the compound of general formula (I), or several different layers wherein at least one layer in the film was generated by using the compound of general formula (I). A film can contain defects like holes. These defects, however, generally constitute less than half of the surface area covered by the film. The film is preferably an inorganic film. In order to generate an inorganic film, all organic ligands L and X have to be removed from the film as described above. More preferably, the film is an elemental metal film. The film can have a thickness of 0.1 nm to 1 µm or above depending on the film formation process as described above. Preferably, the film has a thickness of 0.5 to 50 nm. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 100 nm to 100 µm. The process for forming the films for the electronic elements is particularly well suited for very fine structures. Therefore, electronic elements with sizes below 1 µm are preferred. Examples for electronic elements are field-effect transistors (FET), solar cells, light emitting diodes, sensors, or capacitors. In optical devices such as light emitting diodes or light sensors the film according to the present invention serves to increase the reflective index of the layer which reflects light. An example for a sensor is an oxygen sensor, in which the film can serve as oxygen conductor, for example if a metal oxide film is prepared. In field-effect transistors out of metal oxide semiconductor (MOS-FET) the film can act as dielectric layer or as diffusion barrier. It is also possible to make semiconductor layers out of the films in which elemental nickel-silicon is deposited on a solid substrate.

Preferred electronic elements are transistors. Preferably the film acts as contact in a transistor. If the transistor is made of silicon it is possible that after deposition of nickel or cobalt and heating some silicon diffuses into the nickel to form for example NiSi or $CoSi_2$.

EXAMPLES

Example 1

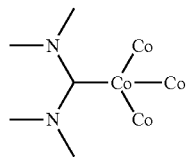

C-1

In a nitrogen atmosphere glovebox, N,N,N',N'-tetramethylformamidinium chloride (0.271 g, 2.0 mmol) was suspended in 15 ml of hexanes in a 40 ml pressure vessel and chilled to −35° C. Lithiumhexamethyldisilazide diethyl etherate ((Et$_2$O)LiHMDS) (0.479 g, 2.0 mmol) was dissolved in 15 ml of tetrahydrofuran and chilled to −35° C. The hexamethyldisilazide solution was added dropwise to the suspension of the formamidinium chloride while stirring, and the two were allowed to react and warmed to room temperature over one hour. The suspension cleared slightly to a more translucent appearance presumably due to the dissolution of formamidinium salt, and the appearance of fine LiCl.

Co(CO)$_3$NO (0.343 g, 2.0 mmol) was added dropwise to the pressure vessel. Sealed, the vessel was brought out of the glovebox and heated in an oil bath to 80° C. while stirring. After one hour at 80° C., the temperature is increased to 100° C. for an additional hour. The resulting deep red solution was allowed to cool, then pumped back into the glovebox. Filtration through a medium frit, and removal of the tetrahydrofuran under vacuum left a deep brown oil, with similarly colored particulate matter. Extraction with 3×2 ml of pentane, and filtration of the extracts gave a ruby red solution.

Compound C-1 was crystallized from this pentane solution at −78° C. after 5 hours under nitrogen atmosphere. Once finished, the supernatant pentane was removed by syringe while holding at −78° C. Residual pentane was removed on high vacuum, and once dry, the solid was allowed to warm to room temperature under nitrogen to afford a dark red liquid (m=230 g, 47%).

IR spectra were collected by placing a drop of compound between two KBr plates under a stream of nitrogen, pressing them to form a film of C-1, and acquiring the spectrum.

IR (KBr plates) (cm-1): 2924.9 (broad) (sp3 CH), 2011.6 (v.s.) (CO), 1939.5 (v.s.) (CO), 1711.6 (v.s.) (NO), 1505.3 (s) (NCN).

$^1$H-NMR (C$_6$D$_6$): δ 2.32 (s, 12H, CH$_3$)

$^1$H-NMR (CDCl$_3$): δ 3.03 (s, 12H, CH$_3$)

$^{13}$C-NMR (C$_6$D$_6$): δ 44.97 (CH$_3$) Carbene carbon is unresolveable. Broadening due to J1 coupling to the Co center is likely the case.

Figure 1:
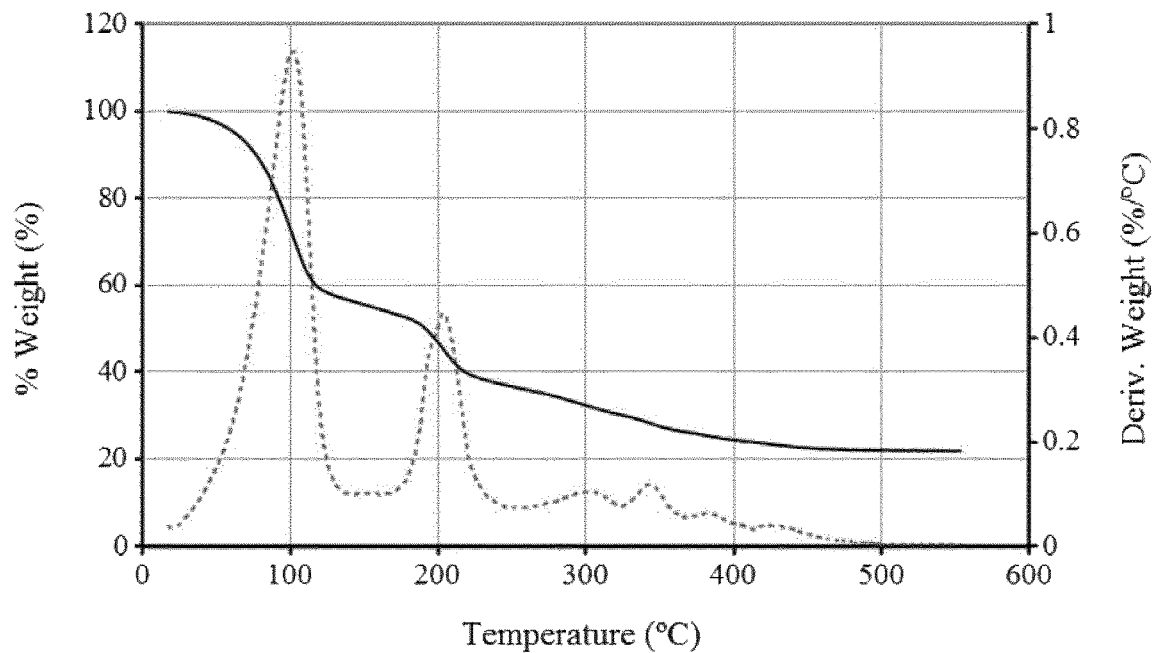
FIG. 1 depicts the thermal gravimetric analysis (TGA) curve of compound C-1.

The thermal gravimetric analysis (TGA) curve of compound C-1 is depicted in FIG. 1.

Example 2

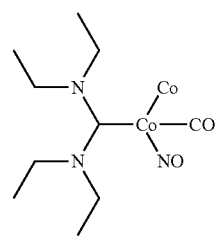

C-2

In a nitrogen atmosphere glovebox, N,N,N',N'-tetraethylformamidinium chloride (0.112 g, 0.6 mmol) was suspended in 5 ml of tetrahydrofuran in a 35 ml round bottomed flask and chilled to −35° C. Co(CO)$_3$NO (0.100 g, 0.6 mmol) was added dropwise to this suspension, rinsing with tetrahydrofuran (1 ml). The dark red suspension quickly changed color to a dark blue-green suspension. This suspension was stirred for 2 hours, after which it was chilled to −35° C.

Lithium hexamethyldisilazide diethyl etherate (0.140 g, 0.6 mmol) was dissolved in 5 ml of tetrahydrofuran, cooled to −35° C. and then added dropwise to the cold dark green-blue suspension described above. This resulted in a color change back to the original red color first observed upon addition of Co(CO)$_3$NO. The reaction was stirred overnight, and was then filtered through a medium frit. Evaporation of the solvent gave a viscous red oil. This material is insoluble in pentane. Extraction with toluene (twice with 3 ml) afforded a red solution, which was filtered and concentrated to a dark red oil. (m=50 mg, 28%)

IR (Neat) (cm$^{-1}$): 2012 (v.s.) (CO), 1945 (v.s.) (CO), 1716 (v.s.) (NO)

$^1$H-NMR (C$_6$D$_6$): δ 3.01 (q, 8H, NCH2CH3) δ 0.78 (t, 12H, NCH$_2$CH$_3$)

$^{13}$C-NMR (C$_6$D$_6$): δ 49.07 (NCH$_2$CH$_3$), δ 14.33 (NCH$_2$CH$_3$)

Example 3

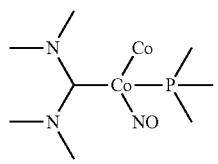

C-3

In an nitrogen atmosphere glovebox, compound C-1 (0.100 g, 0.4 mmol) was dissolved in 5 ml of hexanes in a 15 ml pressure vessel. To this solution was added 0.38 ml of a trimethylphosphine solution in toluene (1.08 M) dropwise while stirring. The pressure vessel was sealed, brought out to an oil bath, and stirred at 100° C. for one hour. The solution was cooled, brought back into the glovebox, transferred to a vial and then chilled at −35° C. overnight. Dark red-brown plate shaped crystals were observed on the bottom of the vial after 24 hours at −35° C. The supernatant solution was decanted. The crystals were washed twice with 1 ml of −35° C. hexanes, and then dried under vacuum. (m=0.80 mg, 66%)

$^1$H-NMR (C$_6$D$_6$): δ 2.52 (s, 12H, NCH$_3$), δ 1.04 (d, 9H, PCH$_3$)

$^{13}$C-NMR (C$_6$D$_6$): δ 45.31 (s, NCH$_3$), δ 20.54 (d, PCH$_3$)

Figure 2:
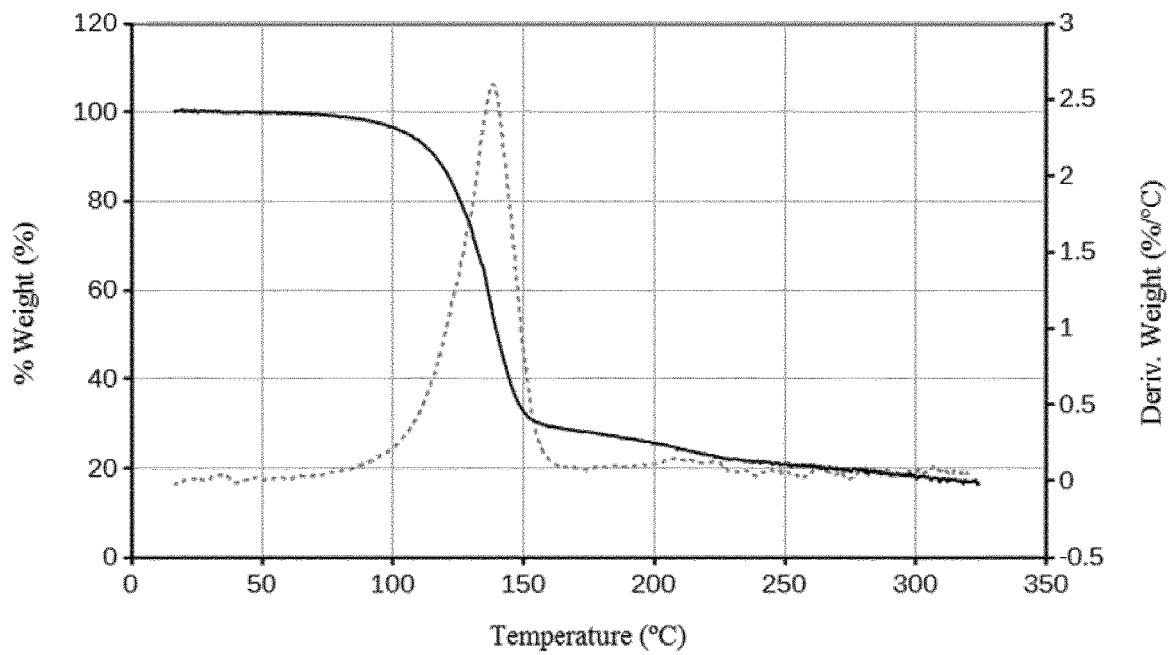
FIG. 2 depicts the TGA curve of compound C-3.

The TGA curve of compound C-3 is depicted in FIG. 2.

The invention claimed is:

1. A process, comprising:
bringing a compound of formula (I) into a gaseous or aerosol state:

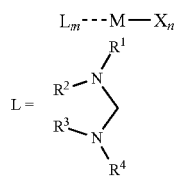

(I)

and
depositing the compound of formula (I) from the gaseous or aerosol state onto a solid substrate, wherein R$^1$, R$^2$, R$^3$, and R$^4$ are each independently an alkyl group, an aryl group or a trialkylsilyl group, M is Mn, Ni or Co, each X is independently a neutrally charged ligand which coordinates M, m is 1, 2 or 3 and n is at least 1, and wherein a molecular weight of the compound of formula (I) is up to 1000 g/mol.

2. The process according to claim 1,
wherein n is at least 2.

3. The process according to claim 1,
wherein X and n are selected to adjust the number of valence electrons of M to an even number.

4. The process according to claim 1,
wherein R$^1$, R$^2$, R$^3$, and R$^4$ are each independently methyl or ethyl.

5. The process according to claim 1,
wherein at least one X is a trialkylphosphine.

6. The process according to claim 1,
wherein at least one X is CO.

7. The process according to claim 1,
wherein M is Co and at least one X is NO.

8. The process according to claim 1,
wherein at least one X is a neutrally charged ligand which coordinates M via at least two neutral nitrogen atoms.

9. The process according to claim 1,
wherein at least one X is a neutrally charged ligand which coordinates M via a phosphor atom.

10. The process according to claim 1,
wherein the compound of formula (I) is chemisorbed on a surface of the solid substrate.

11. The process according to claim 1,
wherein a deposited compound of formula (I) is decomposed by removal of all ligands L and X.

12. The process according to claim 11,
wherein the deposited compound of formula (I) is exposed to a reducing agent.

13. The process according to claim 11,
wherein a sequence of depositing the compound of formula (I) onto the solid substrate and decomposing the deposited compound of formula (I) is performed at least twice.

14. A process for forming a film, comprising:
forming the film with a compound of formula (I):

(I)

on a solid substrate,
wherein R$^1$, R$^2$, R$^3$, and R$^4$ are each independently an alkyl group, an aryl group or a trialkylsilyl group, M is Mn, Ni or Co, each X is independently a neutrally charged ligand which coordinates M, m is 1, 2 or 3 and n is at least 1, and wherein a molecular weight of the compound of formula (I) is up to 1000 g/mol.

* * * * *

UNITED STATES PATENT AND TRADEMARK OFFICE
CERTIFICATE OF CORRECTION

PATENT NO. : 10,801,105 B2  
APPLICATION NO. : 15/775856  
DATED : October 13, 2020  
INVENTOR(S) : Adermann et al.

Page 1 of 1

It is certified that error appears in the above-identified patent and that said Letters Patent is hereby corrected as shown below:

On the Title Page

Column 2, Item (56), under "OTHER PUBLICATIONS", Line 1, "Brittanica" should read -- Britannica --.

In the Specification

In Column 13, Line 60-65, " 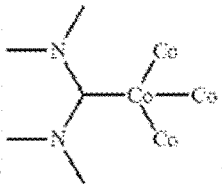 " should read -- 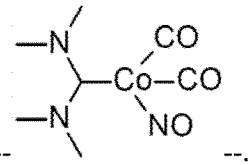 --.

In Column 14, Lines 52-60, " 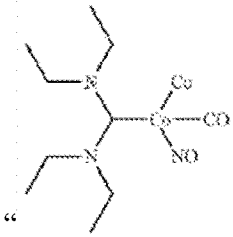 " should read -- 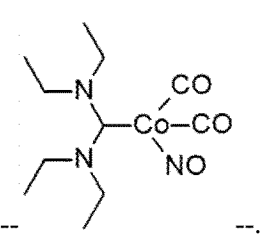 --.

In Column 15, Lines 26-31, " 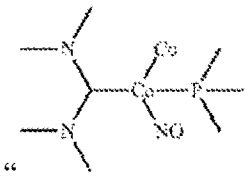 " should read -- 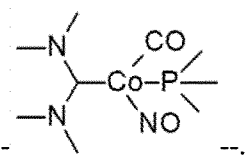 --.

Signed and Sealed this  
Eighteenth Day of May, 2021

Drew Hirshfeld  
*Performing the Functions and Duties of the  
Under Secretary of Commerce for Intellectual Property and  
Director of the United States Patent and Trademark Office*